United States Patent
Chen

(10) Patent No.: US 10,366,660 B2
(45) Date of Patent: Jul. 30, 2019

(54) COLOR FILTER ON ARRAY (COA) SUBSTRATES AND LIQUID CRYSTAL PANELS

(71) Applicant: Shenzhen China Star Optoelectronics Technology Co., Ltd., Shenzhen, Guangdong (CN)

(72) Inventor: Shuai Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 425 days.

(21) Appl. No.: 15/328,480

(22) PCT Filed: Jan. 17, 2017

(86) PCT No.: PCT/CN2017/071338
§ 371 (c)(1),
(2) Date: Jan. 23, 2017

(87) PCT Pub. No.: WO2018/120331
PCT Pub. Date: Jul. 5, 2018

(65) Prior Publication Data
US 2018/0336832 A1    Nov. 22, 2018

(30) Foreign Application Priority Data
Dec. 30, 2016   (CN) .......................... 2016 1 1263251

(51) Int. Cl.
*G02F 1/136* (2006.01)
*G09G 3/34* (2006.01)
(Continued)

(52) U.S. Cl.
CPC .............. *G09G 3/34* (2013.01); *G02B 1/115* (2013.01); *G02F 1/1343* (2013.01);
(Continued)

(58) Field of Classification Search
None
See application file for complete search history.

(56) References Cited

U.S. PATENT DOCUMENTS 5,182,620 A * 1/1993 Shimada ........... G02F 1/136213
257/72
5,782,665 A * 7/1998 Weisfield .......... G02F 1/136209
349/111

(Continued)

FOREIGN PATENT DOCUMENTS

CN    101470308 A    7/2009
CN    101625493 A    1/2010
(Continued)

*Primary Examiner* — James A Dudek
(74) *Attorney, Agent, or Firm* — Andrew C. Cheng

(57) ABSTRACT

The present disclosure relates to a COA substrate including a glass substrate, a common electrode on the glass substrate, an insulation layer on the common electrode, a data line on the insulation layer, and the data line intersects with the common electrode. The COA substrate further includes a first passivation layer, a RGB color-filter layer, and a second passivation layer arranged on the data line in sequence. A disconnected gap is configured at an intersection of the common electrode and the data line such that the common electrode comprises two opposite ends. The insulation layer fills the gap, and the second passivation layer is configured with a conductive layer spanning over two ends of the common electrode. The present disclosure also relates to a liquid crystal panel including the above COA substrate.

16 Claims, 2 Drawing Sheets

(51) Int. Cl.
*G02B 1/115* (2015.01)
*G02F 1/1343* (2006.01)
*G02F 1/1362* (2006.01)

(52) U.S. Cl.
CPC ...... *G02F 1/1362* (2013.01); *G02F 1/136227* (2013.01); *G02F 2001/136222* (2013.01)

(56) References Cited

U.S. PATENT DOCUMENTS

| | | | | |
|---|---|---|---|---|
| 5,953,088 | A * | 9/1999 | Hanazawa | G02F 1/136213 349/110 |
| 6,198,517 | B1 * | 3/2001 | Ohori | G02F 1/136209 349/43 |
| 6,344,885 | B1 * | 2/2002 | Mori | G02F 1/136213 345/93 |
| 6,646,692 | B2 * | 11/2003 | Yamazaki | G02F 1/134363 349/141 |
| 7,414,264 | B2 * | 8/2008 | Kim | H01L 27/124 257/59 |
| 8,107,029 | B2 * | 1/2012 | Peng | G02F 1/136286 349/43 |
| 8,159,641 | B2 * | 4/2012 | Ham | G02F 1/134309 349/139 |
| 9,239,502 | B2 * | 1/2016 | Huang | G02F 1/13458 |
| 9,520,414 | B2 | 12/2016 | Wang | |
| 2001/0040649 | A1 * | 11/2001 | Ozaki | G02F 1/13458 349/43 |
| 2002/0075421 | A1 * | 6/2002 | Wu | G02F 1/136286 349/43 |
| 2002/0109796 | A1 * | 8/2002 | Lin | G02F 1/1368 349/43 |
| 2002/0131003 | A1 * | 9/2002 | Matsumoto | G02F 1/1345 349/139 |
| 2004/0007705 | A1 * | 1/2004 | Song | G02F 1/13458 257/72 |
| 2005/0140858 | A1 * | 6/2005 | Park | G02F 1/13394 349/110 |
| 2006/0012728 | A1 * | 1/2006 | Watamura | G02F 1/136259 349/43 |
| 2010/0072476 | A1 * | 3/2010 | Tseng | G02F 1/136213 257/59 |
| 2013/0161604 | A1 * | 6/2013 | Huang | G02F 1/13458 257/43 |
| 2015/0243791 | A1 * | 8/2015 | Itoh | H01L 27/3265 257/43 |
| 2015/0372010 | A1 * | 12/2015 | Wang | H01L 27/124 257/773 |
| 2018/0336832 | A1 * | 11/2018 | Chen | G02B 1/115 |

FOREIGN PATENT DOCUMENTS

| | | |
|---|---|---|
| CN | 102012589 A | 4/2011 |
| CN | 102981337 A | 3/2013 |
| CN | 104375312 A | 2/2015 |
| CN | 104698713 A | 6/2015 |
| JP | 2008039953 A | 2/2008 |

* cited by examiner

COLOR FILTER ON ARRAY (COA) SUBSTRATES AND LIQUID CRYSTAL PANELS

BACKGROUND OF THE INVENTION

1. Field of the Invention

The present disclosure relates to thin film transistor liquid crystal display (TFT-LCD) technology, and more particularly to a common electrode structure of a COA substrate and a liquid crystal panel for enhancing 4MSK horizontal crosstalk.

2. Discussion of the Related Art

Crosstalk is a common issue with respect to TFT-LCD displays, which means the image in a specific area may affect the image in another area. The crosstalk may include a vertical crosstalk and a horizontal crosstalk according to the location of the crosstalk. Taking the vertical alignment (VA) display mode as one example, the horizontal crosstalk means that the defective issue occurs along a horizontal direction. There are various reasons that may cause the crosstalk, here, only the horizontal crosstalk is discussed. Usually, different driving method may result in different horizontal crosstalk. For instance, the frame inversion may result in line-shaped horizontal crosstalk, and row inversion or column inversion may only cause slight horizontal crosstalk. However, regardless of the driving methods, the defective images are all caused by the capacitance coupling effect between the data line and the common electrode. When the potential of the data line changes, the parasitic capacitance ($C_{DC}$) between the data line and the common electrode line (ACOM) forms an instantaneous potential jump in the common electrode line. IF the signal delay of the common electrode line (ACOM) is more serious or the voltage driving capability is not enough, the potential may not be back to a predetermined potential quickly. The potential jump may pull down a pixel spanning voltage by the coupling effect of the storage capacitance (Cst), which results in a lower brightness so as to form the horizontal crosstalk. With respect to the VA display mode, taking a row inversion as one example, the potential of the driving voltage of on data line is 128 grayscale, and another driving voltage has a two-thirds time of 128 gray-scale potentials, one-third time of 255 grayscale potential. The potentials of the two data lines are periodically inversed such that the potential of the common electrode lines changes accordingly, such change may result in a darker image. The horizontal area of the 255 grayscale potential may include a darker horizontal block due to a greater change of the common electrode line. Usually, the horizontal crosstalk may be solved by adopting the column inversion or the dot inversion. However, such solution may be easily affected by the change of the manufacturing process. That is, the left and the right data line may cause different capacitance coupling effect toward the common electrode line, and thus the horizontal crosstalk may not be eliminated at all. Under 4MASK manufacturing process, the parasitic capacitance ($C_{DC}$) between the data line and the common electrode line includes an AS layer and the N+ layer, such that the parasitic capacitance ($C_{DC}$) may be different in accordance with the positive frame or the negative driving method is adopted, which are respectively represented as $C_{DC}+$ and $C_{DC}-$. Such change may result in a greater difference between the capacitance coupling effect between the two data lines and the common electrode line. Thus, the crosstalk issue may be more serious with respect to 4MASK than to 5MASK.

SUMMARY

To overcome the above issues, a COA substrate and a liquid crystal panel are proposed to reduce the crosstalk issue.

In one aspect, a color filter on array (COA) substrate includes: a glass substrate, a common electrode on the glass substrate, an insulation layer on the common electrode, a data line on the insulation layer, and the data line intersects with the common electrode; the COA substrate further includes a first passivation layer, a RGB color-filter layer, and a second passivation layer arranged on the data line in sequence, a disconnected gap is configured at an intersection of the common electrode and the data line such that the common electrode includes two opposite ends, the insulation layer fills the gap, and the second passivation layer is configured with a conductive layer spanning over two ends of the common electrode.

Wherein the conductive layer connects the two disconnected common electrodes via at least one through hole.

Wherein insulation-layer through holes respectively arranged at two ends of the common electrode on the insulation layer, at least one first-passivation-layer through hole on the first passivation layer and a first-passivation-layer through hole being above the insulation-layer through hole, a RGB-color-filter-layer through hole on the RGB color-filter layer and the RGB-color-filter-layer through hole being above the RGB color-filter layer, a second-passivation-layer through hole on the second passivation layer and the second-passivation-layer through hole being above the RGB-color-filter-layer through hole, and the above through holes are formed in sequence and are connected with each other.

Wherein the conductive layer is a transparent Indium tin oxide (ITO) film.

Wherein the first passivation layer, the RGB color-filter layer and the second passivation layer are all of um level.

Wherein an axial direction of the through hole is perpendicular to a top surface of the common electrode.

Wherein the through hole is of a funnel-like structure.

Wherein a diameter of an upper end opening of the through hole is smaller than the width of the common electrode.

In another aspect, a liquid crystal panel includes: a COA substrate includes a glass substrate, a common electrode on the glass substrate, an insulation layer on the common electrode, a data line on the insulation layer, and the data line intersects with the common electrode; the COA substrate further includes a first passivation layer, a RGB color-filter layer, and a second passivation layer arranged on the data line in sequence, a disconnected gap is configured at an intersection of the common electrode and the data line such that the common electrode includes two opposite ends, the insulation layer fills the gap, and the second passivation layer is configured with a conductive layer spanning over two ends of the common electrode.

Wherein the conductive layer connects the two disconnected common electrodes via at least one through hole.

Wherein at least one insulation-layer through holes respectively arranged at two ends of the common electrode on the insulation layer, at least one first-passivation-layer through hole on the first passivation layer and the first-passivation-layer through hole being above the insulation-layer through hole, at least one RGB-color-filter-layer through hole on the RGB color-filter layer and the RGB-color-filter-layer through hole being above the RGB color-filter layer, at least one second-passivation-layer through hole on the second passivation layer and the second-passivation-layer through hole being above the RGB-color-filter-layer through hole, and the above through hole are formed in sequence and are connected with each other.

Wherein the conductive layer is a transparent Indium tin oxide (ITO) film.

Wherein the first passivation layer, the RGB color-filter layer and the second passivation layer are all of um level.

Wherein an axial direction of the through hole is perpendicular to a top surface of the common electrode.

Wherein the through hole is of a funnel-like structure.

Wherein a diameter of an upper end opening of the through hole is smaller than the width of the common electrode.

In view of the above, the parasitic capacitance generated between the data line and the common electrode may be reduced by increasing the gap between the common electrode and the data line so as to reduce the capacitance coupling effect caused by the data line toward the common electrode. Thus, the crosstalk issue may be reduced.

DETAILED DESCRIPTION OF THE EMBODIMENTS

Embodiments of the invention will now be described more fully hereinafter with reference to the accompanying drawings, in which embodiments of the invention are shown.

The COA array is manufactured by the 4mask manufacturing process. The enhanced portion is the common electrode structure, which is an intersection of the data line and the common electrode in FIGS. 1 and 2.

Figure 1:
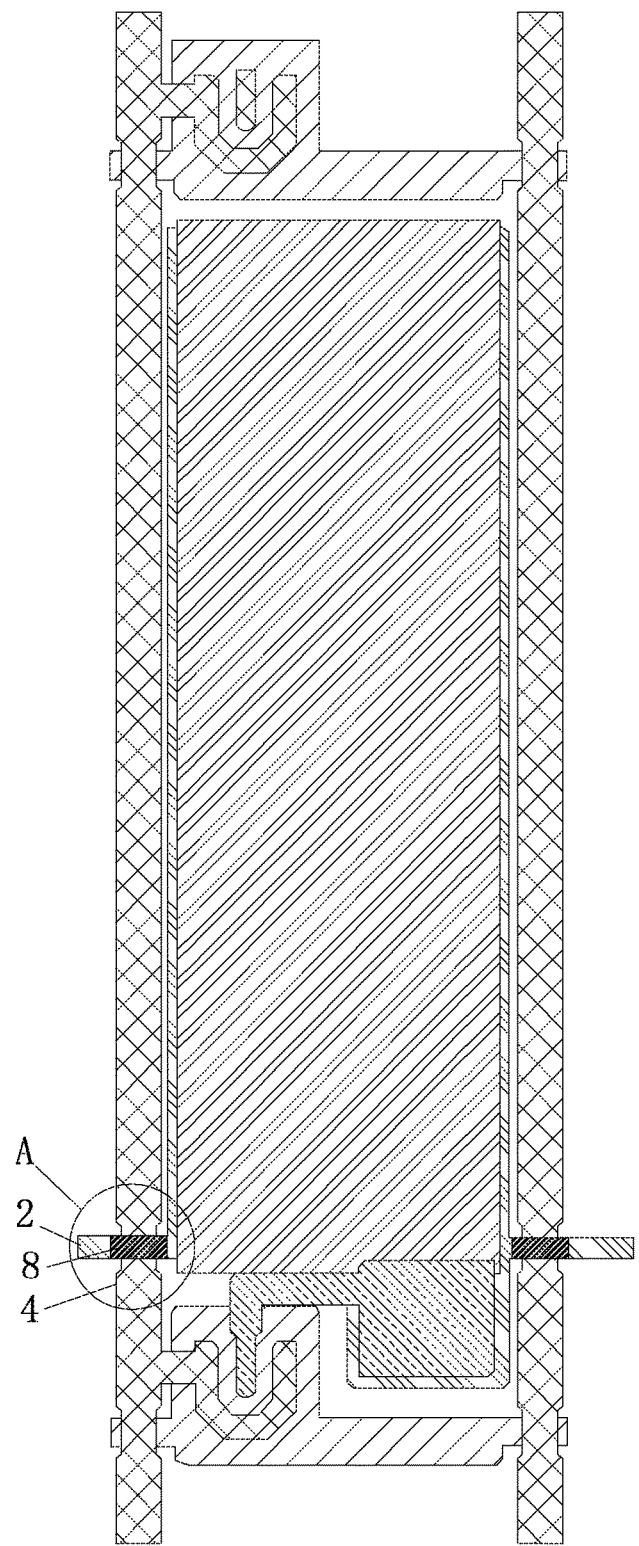
FIG. 1 is a projection view of the pixel structure of the COA substrate in accordance with one embodiment.
Figure 2:
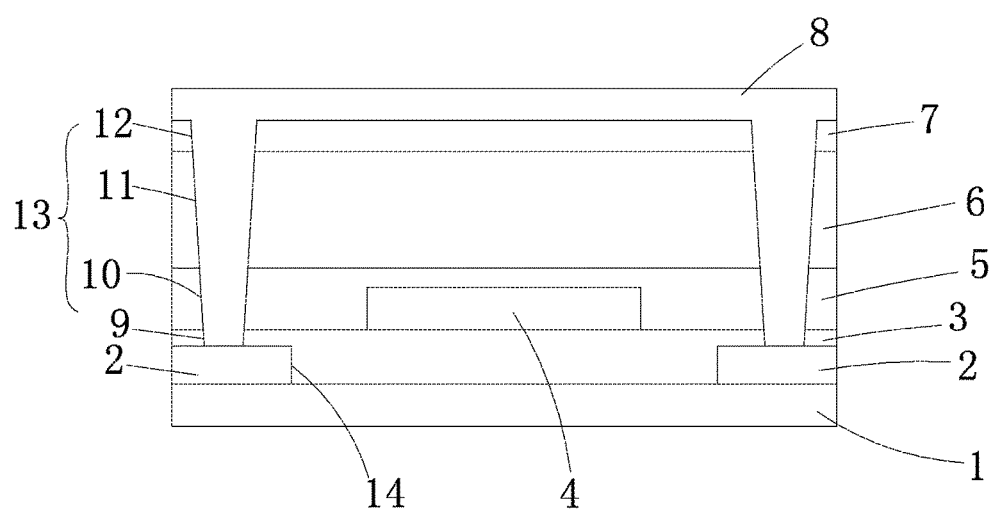
FIG. 2 is a cross section view of the portion "A" in FIG. 1.

As shown in FIGS. 1 and 2, the COA substrate includes a glass substrate 1, a common electrode 2 on the glass substrate 1, an insulation layer 3 on the common electrode 2, a data line 4 on the insulation layer 3, and the data line 4 intersects with the common electrode 2. The COA substrate further includes a first passivation layer 5, a RGB color-filter layer 6, and a second passivation layer 7 on the data line 4 in sequence. A disconnected gap 14 is configured at the intersection of the common electrode 2 and the data line 4 such that the common electrode 2 includes two opposite ends. The insulation layer 3 fills the gap 14, and the second passivation layer 7 is configured with a conductive layer 8 spanning over two ends of the common electrode 2.

The conductive layer 8 connects the two disconnected common electrodes 2 via at least one through hole. At this moment, the capacitor structure formed by the common electrode 2 and the data line is data line/a first passivation layer 5/RGB color-filter layer 6/second passivation layer 7/conductive layer 8. An insulation portion between the two parallel capacitors includes three layers, including the first passivation layer 5, the RGB color-filter layer 6, and the second passivation layer 7, and the thickness of the film is of the um scale. According to the capacitance equation: $C=\varepsilon S/4\pi kd$, the greater the gap between the two metal plates, the smaller the capacitance is. Thus, the capacitance may be effectively reduced.

Specifically, the conductive layer 8 is connected by a through hole 13 and two ends of the common electrode 2.

The through holes 13 includes at least one insulation-layer through holes 9 respectively arranged at two ends of the common electrode 2 on the insulation layer, at least one first-passivation-layer through hole 10 on the first passivation layer 5 and the first-passivation-layer through hole 10 being above the insulation-layer through hole 9, at least one RGB-color-filter-layer through hole 11 on the RGB color-filter layer 6 and the RGB-color-filter-layer through hole 11 being above the RGB color-filter layer 6, at least one second-passivation-layer through hole 12 on the second passivation layer 7 and the second-passivation-layer through hole 12 being above the RGB-color-filter-layer through hole 11. The above through hole are formed in sequence and are connected with each other.

An axial direction of The through hole 13 is perpendicular to a top surface of the common electrode 2, and the through hole 13 is a funnel-like structure. The diameter of the upper end opening of the through hole 13 is smaller than the width of the common electrode 2.

The conductive layer 8 is a transparent Indium tin oxide (ITO) film.

In one embodiment, a liquid crystal panel includes the above COA substrate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A color filter on array (COA) substrate, comprising:
a glass substrate, a common electrode on the glass substrate, an insulation layer on the common electrode, a data line on the insulation layer, and the data line intersects with the common electrode;
the COA substrate further comprises a first passivation layer, a RGB color filter layer, and a second passivation layer arranged on the data line in sequence, a disconnected gap is configured at an intersection of the common electrode and the data line such that the common electrode comprises two opposite ends, the insulation layer fills the gap, and the second passivation layer is configured with a conductive layer spanning over two ends of the common electrode.

2. The COA substrate as claimed in claim 1, wherein the conductive layer connects the two disconnected common electrodes via at least one through hole.

3. The COA substrate as claimed in claim 2, wherein insulation-layer through holes respectively arranged at two ends of the common electrode on the insulation layer, a first-passivation-layer through hole on the first passivation layer and the first-passivation-layer through hole being above the insulation-layer through hole, a RGB-color-filter-layer through hole on the RGB color-filter layer and the RGB-color-filter-layer through hole being above the RGB color-filter layer, a second-passivation-layer through hole on the second passivation layer and the second-passivation-layer through hole being above the RGB-color-filter-layer through hole, and the above through hole are formed in sequence and are connected with each other.

4. The COA substrate as claimed in claim 3, wherein the conductive layer is a transparent Indium tin oxide (ITO) film.

5. The COA substrate as claimed in claim 4, wherein the first passivation layer, the RGB color-filter layer and the second passivation layer are all of um level.

6. The COA substrate as claimed in claim 2, wherein an axial direction of the through hole is perpendicular to a top surface of the common electrode.

7. The COA substrate as claimed in claim 6, wherein the through hole is of a funnel-like structure.

8. The COA substrate as claimed in claim 7, wherein a diameter of an upper end opening of the through hole is smaller than the width of the common electrode.

9. A liquid crystal panel, comprising:
- a COA substrate comprising a glass substrate, a common electrode on the glass substrate, an insulation layer on the common electrode, a data line on the insulation layer, and the data line intersects with the common electrode;
- the COA substrate further comprises a first passivation layer, a RGB color-filter layer, and a second passivation layer arranged on the data line in sequence, a disconnected gap is configured at an intersection of the common electrode and the data line such that the common electrode comprises two opposite ends, the insulation layer fills the gap, and the second passivation layer is configured with a conductive layer spanning over two ends of the common electrode.

10. The liquid crystal panel as claimed in claim 9, wherein the conductive layer connects the two disconnected common electrodes via at least one through hole.

11. The liquid crystal panel as claimed in claim 10, wherein insulation-layer through holes respectively arranged at two ends of the common electrode on the insulation layer, a first-passivation-layer through hole on the first passivation layer and the first-passivation-layer through hole being above the insulation-layer through hole, a RGB-color-filter-layer through hole on the RGB color-filter layer and the RGB-color-filter-layer through hole being above the RGB color-filter layer, a second-passivation-layer through hole on the second passivation layer and the second-passivation-layer through hole being above the RGB-color-filter-layer through hole, and the above through holes are formed in sequence and are connected with each other.

12. The liquid crystal panel as claimed in claim 11, wherein the conductive layer is a transparent Indium tin oxide (ITO) film.

13. The liquid crystal panel as claimed in claim 12, wherein the first passivation layer, the RGB color-filter layer and the second passivation layer are all of um level.

14. The liquid crystal panel as claimed in claim 10, wherein an axial direction of the through hole is perpendicular to a top surface of the common electrode.

15. The liquid crystal panel as claimed in claim 14, wherein the through hole is of a funnel-like structure.

16. The liquid crystal panel as claimed in claim 15, wherein an aperture of an upper end opening of the through hole is smaller than the width of the common electrode.

* * * * *